(12) United States Patent
Chae

(10) Patent No.: US 7,447,110 B2
(45) Date of Patent: Nov. 4, 2008

(54) INTEGRATED CIRCUIT DEVICES HAVING DUAL DATA RATE (DDR) OUTPUT CIRCUITS THEREIN

(75) Inventor: Kwan-Yeob Chae, Seoul (KR)

(73) Assignee: Samsung Electronics Co., Ltd. (KR)

( * ) Notice: Subject to any disclaimer, the term of this patent is extended or adjusted under 35 U.S.C. 154(b) by 52 days.

(21) Appl. No.: 11/539,698

(22) Filed: Oct. 9, 2006

(65) Prior Publication Data

US 2007/0133314 A1    Jun. 14, 2007

(30) Foreign Application Priority Data

Dec. 2, 2005    (KR) ............... 10-2005-0116668

(51) Int. Cl.
  *G11C 8/18*  (2006.01)
  *G11C 7/10*  (2006.01)
(52) U.S. Cl. .................. 365/233.13; 365/189.02; 365/233.5
(58) Field of Classification Search ............ 365/189.02, 365/189.05, 233, 233.1, 233.13
  See application file for complete search history.

(56) References Cited

U.S. PATENT DOCUMENTS

| | | | | |
|---|---|---|---|---|
| 6,154,393 | A * | 11/2000 | Otsuka et al. | 365/189.02 |
| 6,529,993 | B1 * | 3/2003 | Rogers et al. | 711/105 |
| 6,680,637 | B2 * | 1/2004 | Seo | 327/175 |
| 6,760,261 | B2 | 7/2004 | Partsch et al. | |
| 7,167,052 | B2 * | 1/2007 | Heightley et al. | 330/261 |
| 7,282,978 | B2 * | 10/2007 | Lee | 327/175 |
| 2005/0226056 | A1 * | 10/2005 | Hao et al. | 365/189.01 |
| 2005/0243641 | A1 * | 11/2005 | Lee | 365/233 |

FOREIGN PATENT DOCUMENTS

JP    2005-018768    1/2005
KR    100429867 B1    4/2004

* cited by examiner

*Primary Examiner*—Ly D. Pham
(74) *Attorney, Agent, or Firm*—Myers Bigel Sibley & Sajovec

(57) ABSTRACT

A dual data rate (DDR) output circuit has first and second data paths therein that are asymmetric. The first data path is provided through a single-stage latch unit and the second data path is provided through a dual-stage flip-flop device containing a cascaded arrangement of two latch units. The DDR output circuit includes a latch unit, a flip-flop and a buffer circuit. The latch unit is configured to latch-in first data in-sync with a first edge of a clock signal and the flip-flop is configured to latch-in second data in-sync with the first edge of the clock signal. A buffer circuit is also provided. The buffer circuit is electrically coupled to an output of the latch unit and an output of the flip-flop. The buffer circuit is configured to generate the first data at an output terminal of the DDR output circuit in-sync with one edge (e.g. rising or falling) of the clock signal and further configured to generate the second data at the output terminal in-sync with another edge (e.g., falling or rising) of the clock signal.

11 Claims, 9 Drawing Sheets

INTEGRATED CIRCUIT DEVICES HAVING DUAL DATA RATE (DDR) OUTPUT CIRCUITS THEREIN

REFERENCE TO PRIORITY APPLICATION

This non-provisional application claims priority under 35 U.S.C. 119 to Korean Patent Application No. 10-2005-0116668, filed Dec. 2, 2005 in the Korean Intellectual Property Office (KIPO), the entire contents of which are hereby incorporated herein by reference.

FIELD OF THE INVENTION

The present invention relates to integrated circuit devices, and more particularly, to double data rate (DDR) integrated circuit devices.

BACKGROUND OF THE INVENTION

Integrated circuit devices having dual data rate (DDR) capability can support generating output data on both the rising and falling edges of a clock signal. This means that data can be generated at twice the rate of the clock signal frequency. FIG. 1 is a block diagram showing a conventional DDR semiconductor device 100. Referring to FIG. 1, the DDR semiconductor device 100 includes a core block 110, a data output circuit 120, and a data output pad 130. Data D0 and D1 are read from the core block 110. The core block 110 is a memory core block when the semiconductor device 100 is a memory device and may include a processor when the semiconductor device 100 is a memory controller. The two bits of data D0 and D1 read in parallel from the core block 110 are multiplexed by the data output circuit 120, and the multiplexed data DOUT is output to the outside through one of the data output pads 130. Here, the output pad 130 may be a pad used for both inputting and outputting data.

FIG. 2 is a block diagram of the data output circuit 200 according to a prior art. Referring to FIG. 2, the data output circuit 200 includes two flip-flop 121, 122, and a multiplexer 123. A first flip-flop 121 receives one of the data (a first data, D0) between two parallel data D0 and D1, and outputs a first data DA in response to a rising edge of a clock signal CLK. A second flip-flop 122 receives another data (a second data, D1) out of two parallel data D0 and D1, and outputs a second data DB in response to the rising edge of the clock signal CLK. The multiplexer 123 selects and outputs the output data DA of the first flip-flop when the clock signal CLK is a high level, and selects and outputs the output data DB of the second flip-flop when the clock signal CLK is a low level.

FIG. 3 is a signal timing diagram of the data output circuit 200 illustrated in FIG. 2. Here, it is supposed that (D0, D1) is (1,0). The first data D0 is output to a first node N1 after a clock-Q delay $T_{CLK-Q}$ from the rising edge timing point 0 of the clock signal CLK. The clock-Q delay $T_{CLK-Q}$ is a time from the rising edge timing point of the clock signal CLK input to the flip-flop until the data is output to a Q terminal of the flip-flop. As the data DA output to the first node N1 is output through the multiplexer 123, the output data DOUT occurs after a delay time of the multiplexer 123, a multiplexer delay $T_{MUX}$. Therefore, the first data D0 is output as the output data DOUT after the clock-Q delay plus the multiplexer delay (i.e., $T_{CLK-Q}$ plus $T_{MUX}$). On the other hand, as the second data D1 output to the second node N2 is output through the multiplexer 123, it is output as the output data DOUT after the multiplex delay $T_{MUX}$ from a falling edge timing point 1 of the clock signal CLK. Therefore, a duty of the output data DOUT when the clock signal CLK is high level in a first clock cycle from 0 to 2 (i.e., the duty of the output data DOUT when the duty in a high-level period by the first data D0) is $T_{P/2}-T_{CLK-Q}$ but the duty of the output data DOUT when the clock signal CLK is a low level (i.e. the duty in a low-level period by the second data D1) becomes $T_{P/2}$, which causes the duty of two data to become different.

These distortions of the data duty result in a decreasing timing margin. In particular, the duty and a skew of the data become a more important issue when the operating frequency becomes higher. Therefore, the data duty of the data output circuit in a DDR mode needs to be improved to increase the reliability of high frequency semiconductor devices.

SUMMARY OF THE INVENTION

Embodiments of the invention include a dual data rate (DDR) output circuit having uniform timing margins that apply to data output operations associated with both leading and trailing edges of a clock signal. According to some of these embodiments, the DDR output circuit has first and second data paths therein that are asymmetric. The first data path is provided through a single-stage latch unit and the second data path is provided through a dual-stage flip-flop device containing a cascaded arrangement of two latch units. In particular, the DDR output circuit includes a latch unit, a flip-flop and a buffer circuit. The latch unit is configured to latch-in first data in-sync with a first edge of a clock signal and the flip-flop is configured to latch-in second data in-sync with the first edge of the clock signal. A buffer circuit is also provided. The buffer circuit is electrically coupled to an output of the latch unit and an output of the flip-flop. The buffer circuit is configured to generate the first data at an output terminal of the DDR output circuit in-sync with one edge (e.g., rising or falling) of the clock signal and further configured to generate the second data at the output terminal in-sync with another edge (e.g., falling or rising) of the clock signal.

According to aspects of these embodiments, the flip-flop is a master-slave flip-flop and the latch unit is a D-type latch unit. In particular, the latch unit may be a negative-edge triggered latch and the flip-flop may include a negative-edge triggered master latch and a positive-edge triggered slave latch. The buffer circuit may include a first tri-state buffer having an input electrically coupled to the output of the latch unit and a second tri-state buffer having an input electrically coupled to the output of the flip-flop. In some of these embodiments, the first tri-state buffer is a non-inverting buffer and the second tri-state buffer is a non-inverting buffer. Alternatively, in the event the output of the latch unit is a complementary output (e.g., QB) and the output of the flip-flop is a complementary output (e.g., QB), then the buffer circuit may include a first tri-state inverting buffer having an input electrically coupled to the output of the latch unit and a second tri-state inverting buffer having an input electrically coupled to the output of the flip-flop.

BRIEF DESCRIPTION OF THE DRAWINGS

The above and other features and advantages of the present invention will become more apparent by describing in detail the exemplary embodiments thereof with reference to the attached drawings in which.

DETAILED DESCRIPTION OF THE INVENTION

Figure 1:
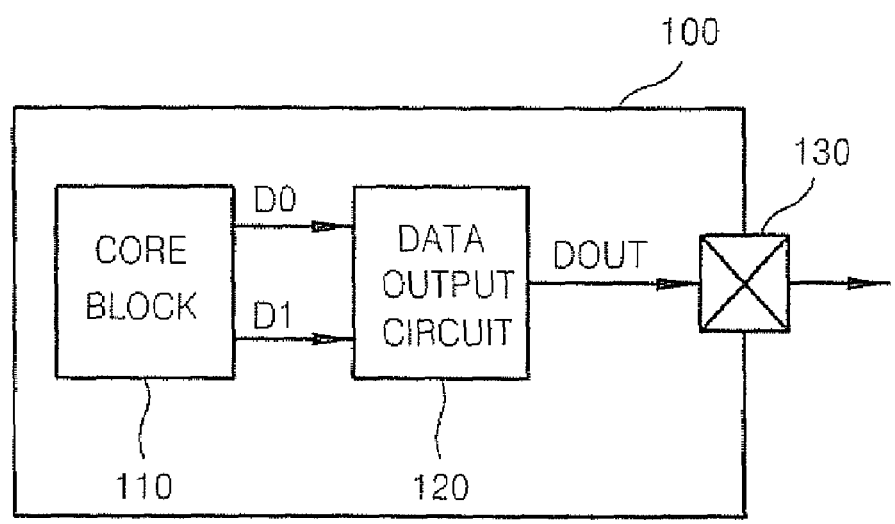
FIG. 1 is a block diagram of a conventional DDR semiconductor device.
Figure 2:
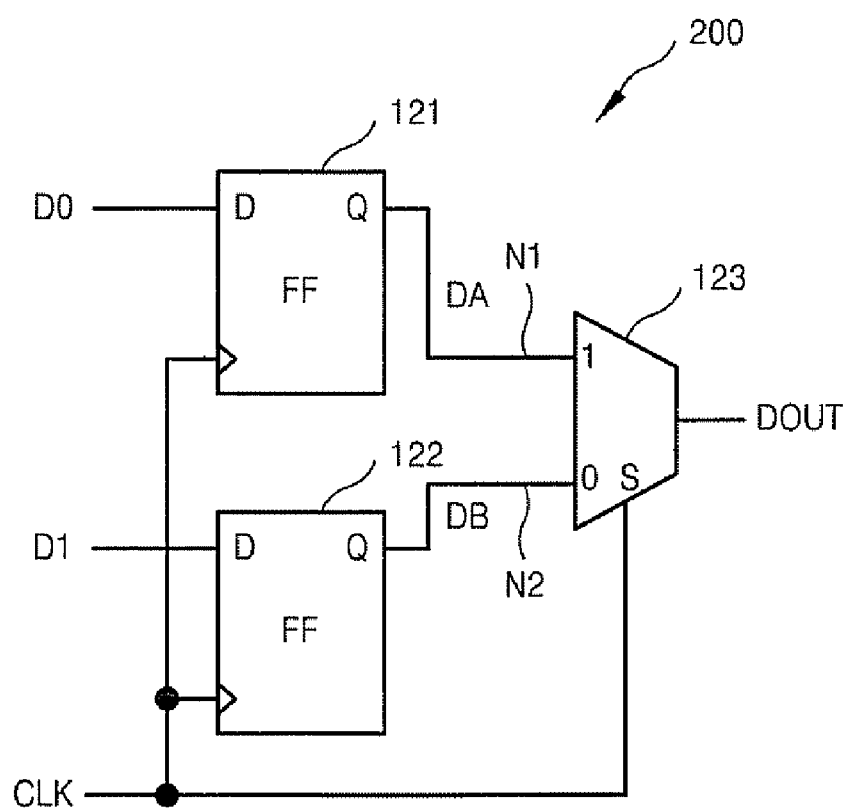
FIG. 2 is a block diagram of a data output circuit according to the prior art.
Figure 3:
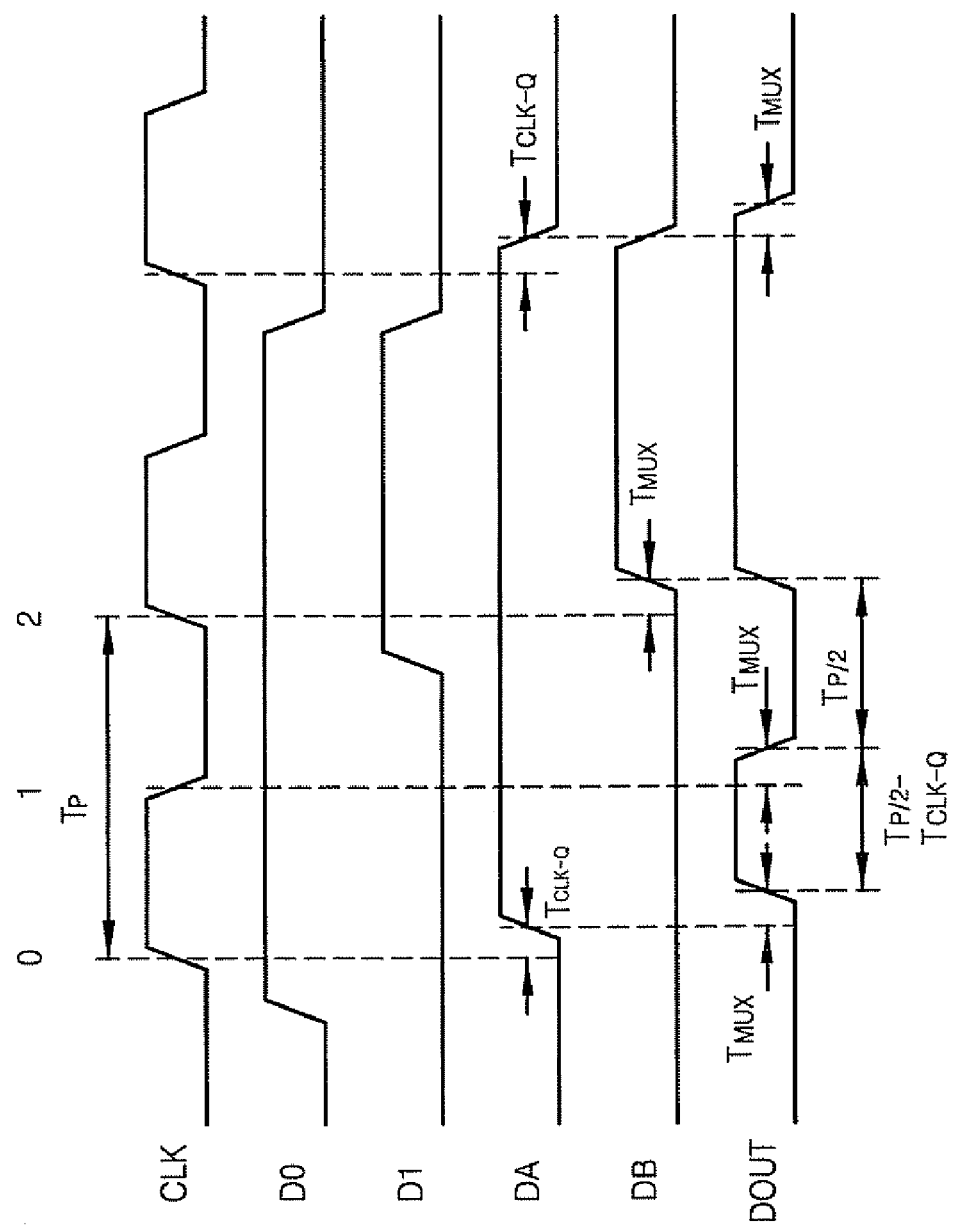
FIG. 3 is a signal timing diagram that illustrates operations of the data output circuit illustrated in FIG. 2.

The present invention now will be described more fully herein with reference to the accompanying drawings, in which preferred embodiments of the invention are shown. This invention may, however, be embodied in many different forms and should not be constructed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters.

Figure 4:
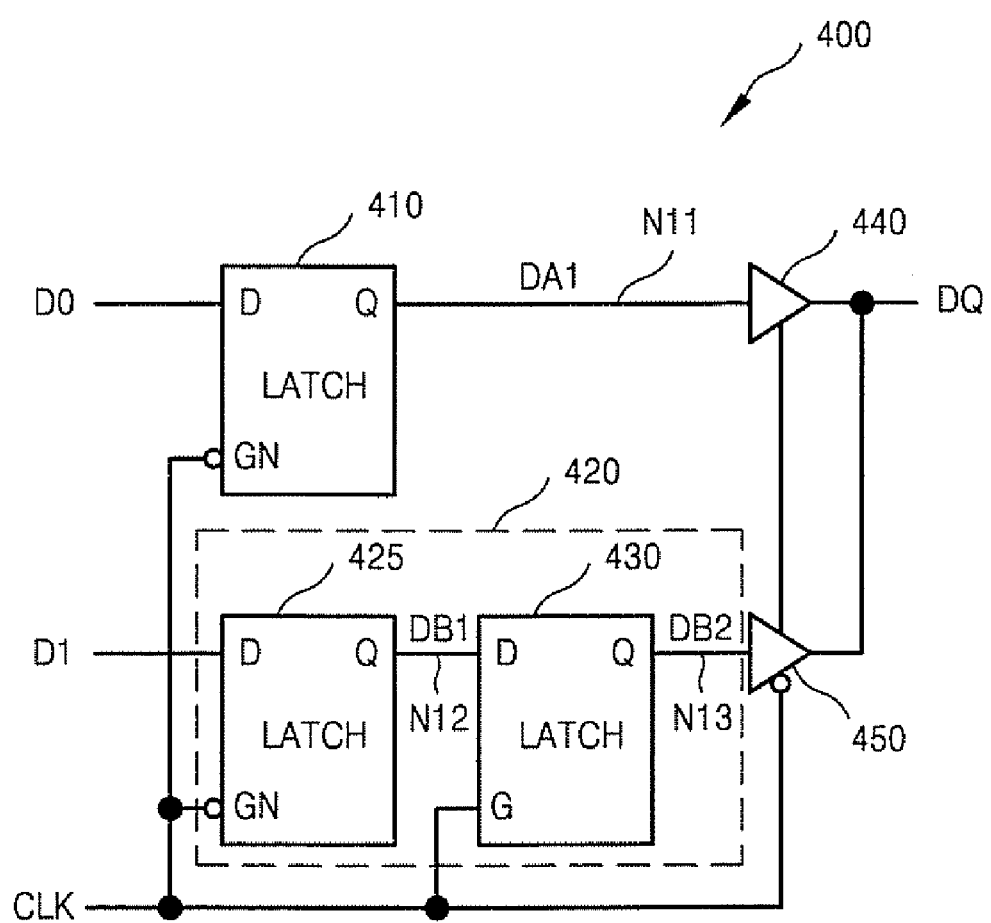
FIG. 4 is a circuit diagram showing a data output circuit according to an embodiment of the present invention.
Figure 5:
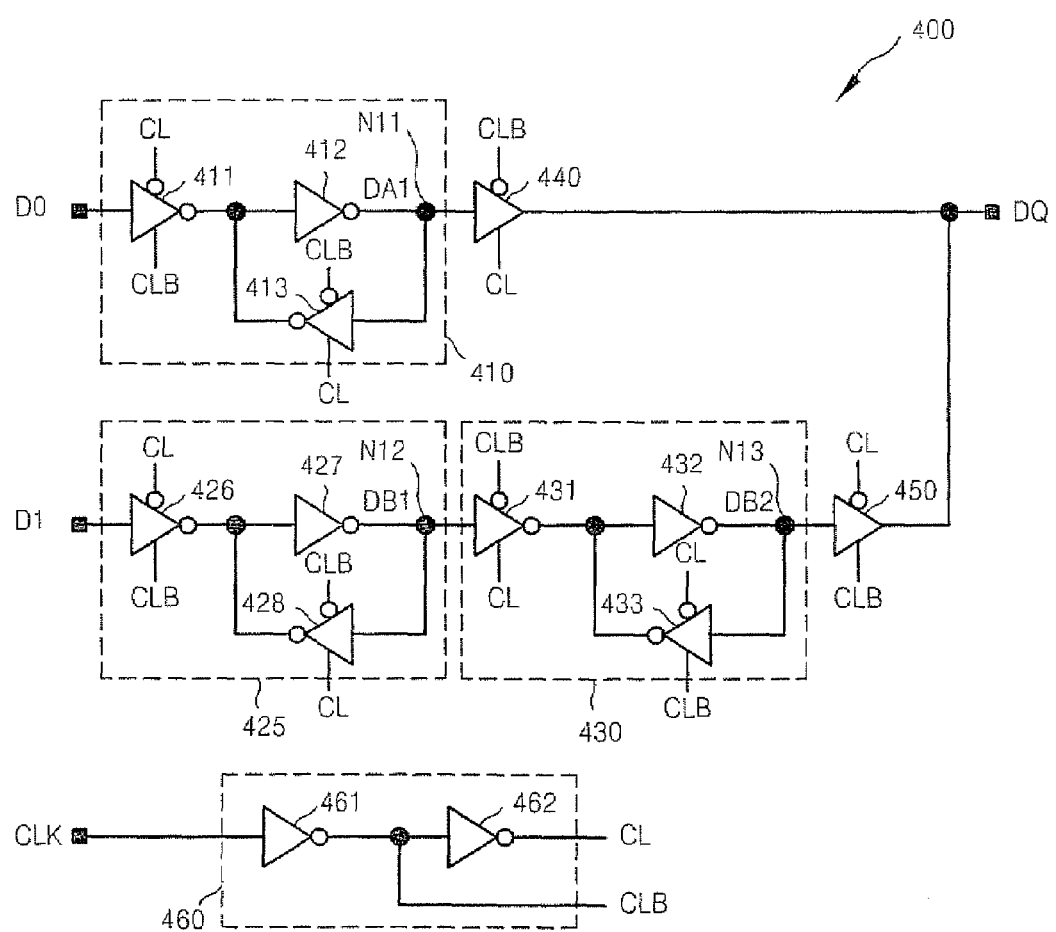
FIG. 5 is a detailed electrical schematic of the data output circuit illustrated in FIG. 4.

FIG. 4 is a circuit diagram showing a data output circuit 400 of a DDR semiconductor device according to an embodiment of the present invention. Referring to FIGS. 4 and 5, the data output circuit 400 includes a latch 410, a flip-flop 420, and first and second buffers 440, 450, respectively.

The latch 410 receives first data D0 inputted to an input terminal D in response to a first logic level(hereinafter, called as low level) and outputs it to an output terminal Q. That is, the first data D0 is transmitted to a first node N11 during a low level period of the clock signal CLK. In a period of a second logic level(hereinafter, called as high level) of the clock signal, a route between the input terminal and the output terminal Q of the latch 410 is blocked. Therefore, the output data DAI of the latch 410 in this period (i.e., the data DA1 of the first node) is not changed.

The latch 410 as illustrated in FIG. 5 includes a plurality of inverters 411, 412, 413. The inverters 411, 413 operate in response to a right clock signal CL and a inverted clock signal CLB respectively. The inverted clock signal CLB is formed by inverting the clock signal CLK once, the right clock signal CL is formed by inverting the inverted clock signal CLB once again. Therefore, the right clock signal CL and the inverted clock signal CLB according to FIG. 5 may be generated by using two inverters 461 and 462 connected in series. The first buffer 440 buffers and outputs the output signal DA1 of the latch 410 in response to a first edge (hereinafter called as a rising edge) of the clock signal CLK1. Therefore, the output data DA1 of the latch 410 is output through the output terminal DQ while the clock signal CLK is high level.

The flip-flop 420 latches the second data D1 in response to the rising edge of the clock signal CLK and outputs it to a third node N13. Specifically, the flip-flop 420 includes a master latch 425 and a slave latch 430. The master latch 425 receives the second data D1 input to the input terminal D in response to the low level of the clock signal CLK, and outputs it to the output terminal Q. The slave latch 430 receives the output data DB1 of the master latch 425 during a high level period of the clock signal CLK, and outputs it to the output terminal Q.

Accordingly, the second data D1 is transmitted to the second node N12 during the low level period of the clock signal CLK, and is Output to a third node N13 after being latched at the moment of the rising edge of the clock signal CLK. The master latch 425 and the slave latch 430 of FIG. 5 may be formed of a plurality of inverters 426, 427, 428 and 431, 432, 433.

A second buffer 450 buffers and outputs the output signal DB2 of the flip-flop 420 in response to the second edge (hereinafter called as a falling edge) of the clock signal CLK. Therefore, the output data DB2 of the slave latch 430 is output through the output terminal DQ while the clock signal is low level. Accordingly, the data output circuit 400 latches the first and the second data D0 and D1 at the rising edge of the clock signal CLK, outputs the first data D0 in the high level period of the clock signal CL1, and outputs the second data D1 in the low level period.

It is preferable that each of the first and the second buffer 440 and 450 be a tri-state buffer. The tri-state buffer includes a high impedance state (Hi-Z) in addition to a high level and a low level state.

Figure 6:
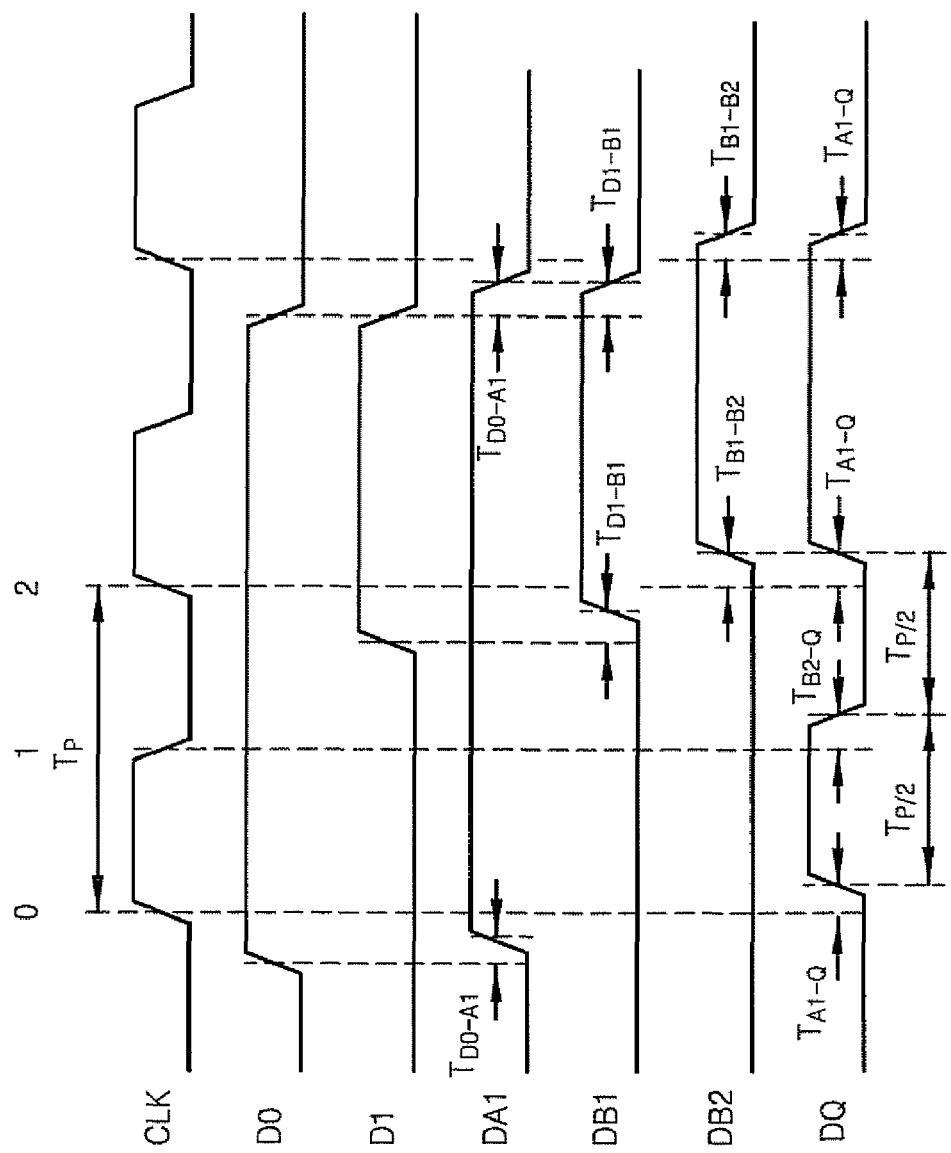
FIG. 6 is a signal timing diagram that illustrates operation of the data output circuit illustrated in FIG. 4.

FIG. 6 is a signal timing diagram of the output circuit 400 illustrated in FIG. 4. Here, the first and the second data D0 and D1 of the first clock cycle (0~2) are each supposed to be 1 and 0, and the first and the second data D0 and D1 of the next clock cycle are supposed to be 1 and 1 respectively. Referring to FIGS. 4 and 6, an operation of the data output circuit 400 may be explained as follows. In particular, an explanation is provided regarding the first and the second data (D0, D1)(1,0) of the first clock cycle (0~2).

The first latch 410 and the master latch 425 output the first and the second data D0 and D1 input in a low level period of the clock signal CLK respectively. Therefore, the first and the second data D0 and D1 in the low level period of the clock signal CLK are transmitted to the first and the second node N11 and N12 respectively. Here, the first and the second data D0 and D1 are respectively shown at the first and the second node N11 and N12 after a first latch delay $T_{D0-A1}$ and a master latch delay $T_{D1-B1}$ respectively.

The data DA of the first node is outputted to the output terminal DQ at a timing point when the clock signal CLK is changed to the high level. Here, a $T_{A1-Q}$ delay is required until the data DA1 of the first node is outputted to the output terminal DQ. When the clock signal CLK is changed to the high level, the routes from the input terminal D of the first latch 410 to the first node N1, and from the input terminal D of the master latch 425 to the second node N12 are blocked. Therefore, the data DA1 and DB1 of the first and the second node are maintained without a change till the next low level period of the clock signal CLK.

While the clock signal CLK is at a high level, the first buffer 440 drives continuously the output terminal DQ in response to the data DA1 of the first node. In the meantime, while the clock signal CLK is at a high level, the data DB1 of the second node is transmitted to the third node N13 through the slave latch 430. Here, the data DB1 of the second node occurs at the third node N13 after the slave latch delay $T_{B1-B2}$.

At the moment 1 when the clock signal is changed from the high level to the low level, the data DB2 of the third node is output to the output terminal DQ. Here, the $T_{B2-Q}$ delay is required until the data DB2 of the third node is outputted to the output terminal DQ. While the clock signal CLK is at the low level, the second buffer 450 keeps driving the output terminal DQ in response to the data DB2.

Accordingly, as illustrated in FIG. 6, each of the high level period and the low level period of the output terminal DQ is equally $T_{P/2}$. Therefore, the distortion of the data duty is prevented, and the data skew is reduced. In particular, since the load from the first node N11 to the output terminal DQ is as the same as the load from the third node N13 to the output terminal DQ, it is easy to design $T_{A1-Q}$ as the same as $T_{B2-Q}$.

Consequently, the duty and the skew of the output data are improved according to the present invention. And the data output circuit of the present invention may be implemented to a smaller transistor compared to a conventional data output circuit. Therefore, the load of the clock signal CLK may be reduced compared to the conventional technique.

Figure 7:
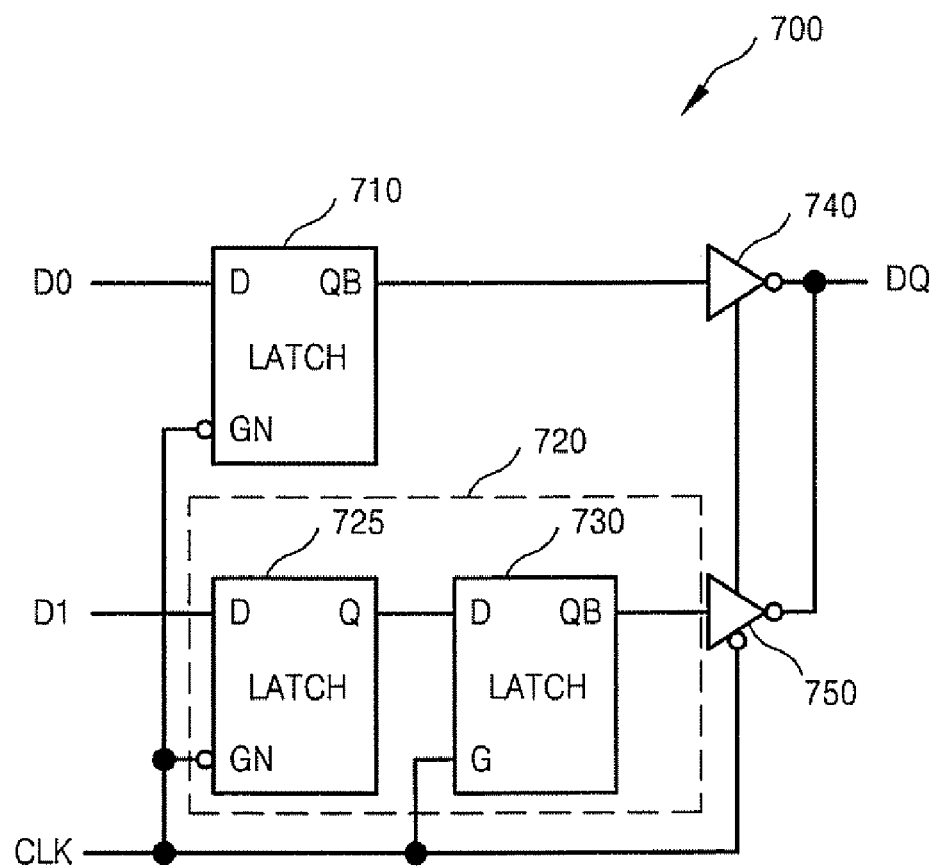
FIGS. 7 to 9 are block diagrams of data output circuits according to other embodiments of the present invention
Figure 8:
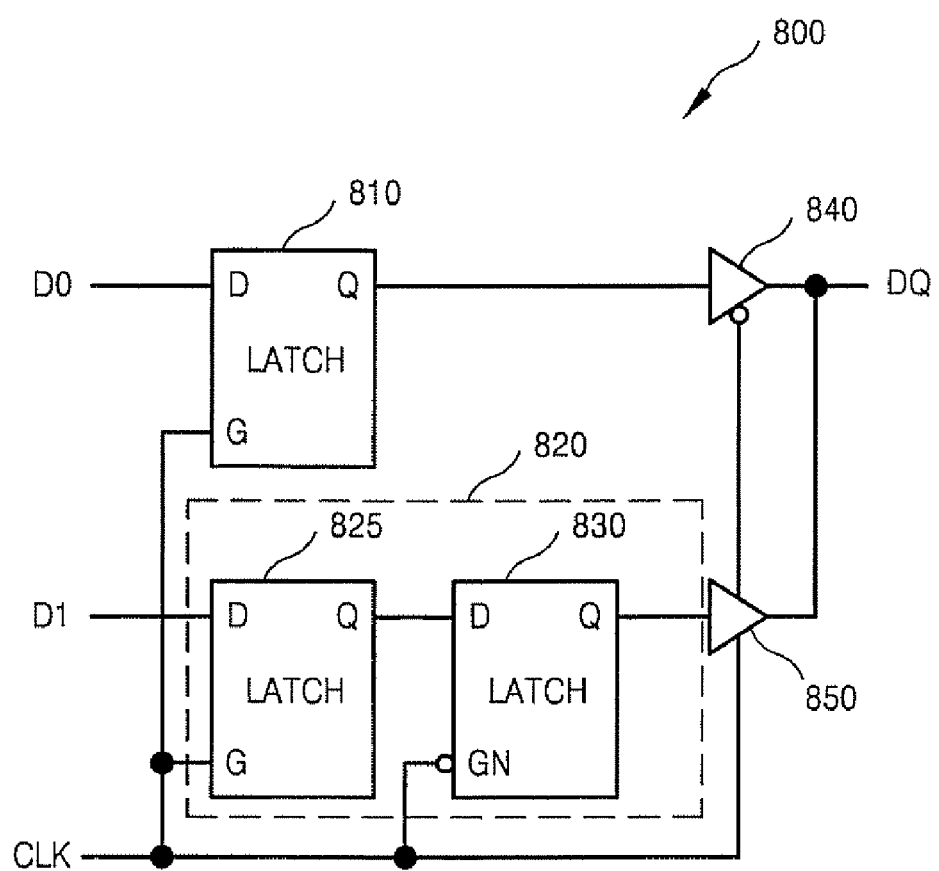
Figure 9:
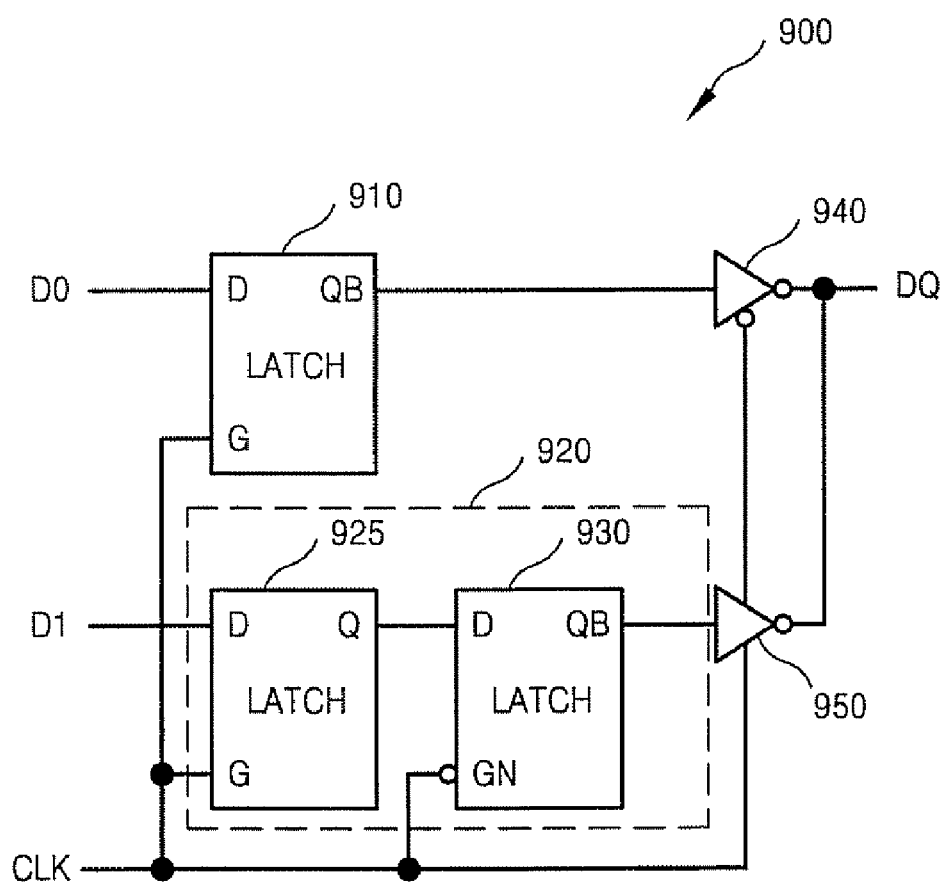

FIGS. 7 to 9 are block diagrams of the data output circuit according to other embodiments of the present invention. The data output circuit 700 of FIG. 7 includes the latch 710, the flip-flop 720, the first and the second inverter 740 and 750. Compared to the data output circuit 400 illustrated in FIG. 4, the operation of the data output circuit 700 illustrated in FIG. 7 is explained as follows.

The only difference between the latch 710 and the latch 410 of FIG. 4 is that the latch 710 outputs the data to the inverse output terminal QB. The master latch 725 is as the same as the master latch 425 shown in FIG. 4. But, the slave latch 730 has a difference from the slave latch 430 illustrated in FIG. 4 because the slave latch 730 outputs the data to the inverse output terminal QB. The first inverter 740 inverts and outputs the output data of the latch 710 in-sync with a low-to-high edge of the clock signal CLK. The second inverter 750 inverts and outputs the output data of the flip-flop 720 in-sync with a high-to-low edge of the clock signal.

Accordingly, the data output circuit 700, like the data output circuit 400 illustrated in FIG. 4, latches the first and the second data D0, D1 at the rising edge of the clock signal CLK, outputs the first data D0 during the high level period of the clock signal CLK, and outputs the second data D1 during the low level period of the clock signal CLK.

The data output circuit 800 of FIG. 8 has a structure similar to the data output circuit 400 of FIG. 4. But, compared with the data output circuit 400 of FIG. 4, the data output circuit 800 of FIG. 8 operates complementarily to the clock signal CLK. In particular, the latch 810, the master latch 825, the slave latch 830, the first and the second buffer 840, 850 are connected in a complementary relationship with the latch 410, the master latch 425, the slave latch 430, the first and the second buffer 440, 450 of FIG. 4 on a basis of the clock signal CLK. Thus, the data output circuit 800 illustrated in FIG. 8 latches the first and the second data D0, D1 at the falling edge of the clock signal CLK, outputs the first data D0 during the low level period of the clock signal CLK, and outputs the second data D1 during the high level period.

The data output circuit 900 illustrated in FIG. 9 has the same structure as the data output circuit 500 of FIG. 5. But, compared with the data output circuit 500 of FIG. 5, the data output circuit 900 illustrated in FIG. 9 operates complementarily to the clock signal CLK. That is, the latch 910, the master latch 925, the slave latch 930, the first and the second inverter 940, 950 are connected in a complementary relationship relative to the latch 510, the master latch 525, the slave latch 530, the first and the second inverter 540, 550 of FIG. 5 on a basis of the clock signal CLK. Thus, the data output circuit 900 illustrated in FIG. 9, like the data output circuit 800 of FIG. 8, latches the first and the second data D0, D1 at the falling edge of the clock signal CLK, outputs the first data D1 during the low level period of the clock signal CLK, and outputs the second data D1 during the high level period.

According to embodiments of the present invention, the data skew is reduced by improving the duty rate of the data output from the semiconductor device in a DDR mode. Accordingly, the reliability of the semiconductor device is improved by improving the timing margin. Also, while the data output circuit according to the conventional technique generally includes more than two flip-flops, where one flip-flop is composed of two latches, the data output circuit of the present invention includes three latches, which is a decrease in the number of the latches and may implement the circuit in a simpler way.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A dual data rate (DDR) output circuit, comprising:
a latch unit configured to latch in first data with a first level of a clock signal having a 50% duty cycle;
a flip-flop configured to latch-in second data in-synch with a first edge of the clock signal and pass the second data to an output thereof in-synch with a second edge of the clock signal; and
a buffer circuit electrically coupled to an output of said latch unit and an output of said flip-flop, said buffer circuit configured to generate the first data at an output terminal of the DDR output circuit in-synch with one edge of the clock signal and further configured to generate the second data at the output terminal in-synch with another edge of the clock signal;
wherein the first edge of the clock signal is a high-to-low edge of the clock signal and the second edge of the clock signal is a low-to-high edge of the clock signal; and wherein the one edge of the clock signal is a low-to-high edge of the clock signal and the another edge of the clock signal is a high-to-low edge of the clock signal.

2. The DDR output circuit of claim 1, wherein said flip-flop is a master-slave flip-flop.

3. A dual data rate (DDR) output circuit, comprising:
a latch unit configured to latch-in first data with a first level of a clock signal having a 50% duty cycle;
a flip-flop configured to latch-in second data in-synch with a first edge of the clock signal and pass the second data to an output thereof in-synch with a second edge of the clock signal; and
a buffer circuit electrically coupled to an output of said latch unit and an output of said flip-flop, said buffer circuit configured to generate the first data at an output terminal of the DDR output circuit in-synch with one edge of the clock signal and further configured to generate the second data at the output terminal in-synch with another edge of the clock signal;
wherein said latch unit is a negative-level triggered latch; and wherein said flip-flop comprises a negative-level triggered master latch and a positive-level triggered slave latch that are both responsive to the clock signal.

4. The DDR output circuit of claim 1, wherein said buffer circuit comprises a first tri-state buffer having an input electrically coupled to the output of said latch unit and a second tri-state buffer having an input electrically coupled to the output of said flip-flop.

5. The DDR output circuit of claim 4, wherein the first tri-state buffer is a non-inverting buffer and the second tri-state buffer is a non-inverting buffer.

6. The DDR output circuit of claim 1, wherein the output of said latch unit is a complementary output; wherein the output of said flip-flop is a complementary output; and wherein the said buffer circuit comprises a first tri-state inverting buffer having an input electrically coupled to the output of said latch unit and a second tri-state inverting buffer having an input electrically coupled to the output of said flip-flop.

7. A dual data rate (DDR) output circuit, comprising:
a latch unit configured to latch-in first data with a first level of a clock signal having a 50% duty cycle;
a flip-flop configured to latch-in second data in-synch with a first edge of the clock signal and pass the second data to an output thereof in-synch with a second edge of the clock signal; and
a buffer circuit electrically coupled to an output of said latch unit and an output of said flip-flop, said buffer circuit configured to generate the first data at an output terminal of the DDR output circuit in-synch with one edge of the clock signal and further configured to generate the second data at the output terminal in-synch with another edge of the clock signal;
wherein the first edge of the clock signal is a low-to-high edge of the clock signal; and wherein the one edge of the clock signal is a high-to-low edge of the clock signal and the another edge of the clock signal is a low-to-high edge of the clock signal; and
wherein the output of said latch unit is a complementary output; wherein the output of said flip-flop is a complementary output; and wherein the buffer circuit comprises a first tri-state inverting buffer having an input electrically coupled to the output of said latch unit and a second tri-state inverting buffer having an input electrically coupled to the output of said flip-flop.

8. A dual data rate (DDR) output circuit, comprising:
a single-stage latch unit configured to latch-in first data with a first level of a clock signal having a 50% duty cycle;
a dual-stage flip-flop configured to latch-in second data in-synch with a first edge of the clock signal and pass the second data to an output thereof in-synch with a second edge of the clock signal; and
a buffer circuit electrically coupled to an output of said latch unit and an output of said flip-flop, said buffer circuit configured to generate the first data at an output terminal of the DDR output circuit in-synch with one edge of the clock signal and further configured to generate the second data at the output terminal in-synch with another edge of the clock signal;
wherein said buffer circuit comprises a first tri-state buffer having an input electrically coupled to the output of said latch unit and a second tri-state buffer having an input electrically coupled to the output of said flip-flop; and
wherein said buffer circuit provides equivalent delays to the first and second data generated at the outputs of said latch unit and said flip-flop, respectively.

9. The DDR output circuit of claim 8, wherein the first tri-state buffer is a non-inverting buffer and the second tri-state buffer is a non-inverting buffer.

10. A data output circuit of a double data rate (DDR) semiconductor device, comprising:
a first latch circuit outputting an output data corresponding to a first data in response to a first logic level of a clock signal having a 50% duty cycle;
a flip-flop circuit latching second data in-synch with a first edge of the clock signal and outputting the second data in-synch with a second edge of the clock signal; and
a buffer circuit driving an output terminal in response to the output data of the first latch circuit during a second logic level of the clock signal, driving the output terminal in response to the output data of the flip-flop circuit during the first logic level of the clock signal;
wherein the buffer circuit comprises:
a first tri-state buffer buffering or inverting the output data of the first latch circuit and outputting the buffered data or the inverted data during the first logic level of the clock signal; and
a second tri-state buffer buffering or inverting the output data of the slave latch and outputting the buffered data or the inverted data during the second logic level of the clock signal; and
wherein a delay provided by the first tri-state buffer is equivalent to a delay provided by the second tri-state buffer.

11. The data output circuit of the DDR semiconductor device of claim 10, wherein the flip-flop circuit comprises:
a master latch outputting a data corresponding to the second data in response to the first logic level of the clock signal; and
a slave latch outputting a data corresponding to an output data of the master latch in response to the second logic level of the clock signal.

* * * * *